(12) United States Patent
Goergen et al.

(10) Patent No.: US 12,160,948 B2
(45) Date of Patent: *Dec. 3, 2024

(54) INTEGRATING GRAPHENE INTO THE SKIN DEPTH REGION OF HIGH SPEED COMMUNICATIONS SIGNALS FOR A PRINTED CIRCUIT BOARD

(71) Applicant: Cisco Technology, Inc., San Jose, CA (US)

(72) Inventors: Joel Goergen, Soulsbyville, CA (US); Scott Hinaga, Palo Alto, CA (US); Jessica Kiefer, San Jose, CA (US); Alpesh Umakant Bhobe, Sunnyvale, CA (US); D. Brice Achkir, Livermore, CA (US); David Nozadze, San Jose, CA (US); Amendra Koul, San Francisco, CA (US); Mehmet Onder Cap, Sunnyvale, CA (US); Madeline Marie Roemer, Los Altos, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/337,724

(22) Filed: Jun. 20, 2023

(65) Prior Publication Data

US 2023/0354505 A1 Nov. 2, 2023

Related U.S. Application Data

(63) Continuation of application No. 17/703,051, filed on Mar. 24, 2022, now Pat. No. 11,751,322, which is a
(Continued)

(51) Int. Cl.
*H05K 1/02* (2006.01)

(52) U.S. Cl.
CPC ......... *H05K 1/0239* (2013.01); *H05K 1/0242* (2013.01); *H05K 2201/09245* (2013.01)

(58) Field of Classification Search
CPC ............... H05K 1/0239; H05K 1/0242; H05K 2201/09245
See application file for complete search history.

(56) References Cited

U.S. PATENT DOCUMENTS 9,793,214 B1 * 10/2017 Venugopal ........ H01L 23/53214
2003/0196749 A1 10/2003 Japp et al.
(Continued)

OTHER PUBLICATIONS

Kim S., et al., "Compact Equivalent Circuit Models for the Skin Effect," Jun. 1996, 26 Pages.
(Continued)

*Primary Examiner* — Hoa C Nguyen
(74) *Attorney, Agent, or Firm* — Edell, Shapiro & Finnan, LLC

(57) ABSTRACT

A conductive signal transmission structure for a printed circuit includes a copper material and a graphene layer disposed within the copper material at a depth below a surface of the structure. The depth of the graphene layer is further within a skin depth region of the structure when a transmission signal applied to the conductive signal transmission structure has a signal speed of at least 112 Gbps and/or a Nyquist frequency that is at least about 14 gigahertz (GHz).

20 Claims, 10 Drawing Sheets

Related U.S. Application Data continuation of application No. 17/079,970, filed on Oct. 26, 2020, now Pat. No. 11,330,702.

(60) Provisional application No. 63/016,500, filed on Apr. 28, 2020.

(56) References Cited

U.S. PATENT DOCUMENTS

| | | |
|---|---|---|
| 2011/0006425 A1 | 1/2011 | Wada et al. |
| 2015/0017344 A1* | 1/2015 | Dong .................... B82Y 40/00 427/249.6 |
| 2015/0131246 A1 | 5/2015 | Moul et al. |
| 2016/0057854 A1* | 2/2016 | Schneider ............ H05K 3/4608 165/185 |
| 2017/0145561 A1 | 5/2017 | Farquhar et al. |
| 2017/0271594 A1 | 9/2017 | Barth |
| 2018/0102197 A1 | 4/2018 | Adams |
| 2018/0330842 A1 | 11/2018 | Rastogi et al. |
| 2019/0116663 A1 | 4/2019 | Findley |
| 2020/0294684 A1 | 9/2020 | Bayes et al. |
| 2020/0294685 A1 | 9/2020 | Bayes et al. |
| 2020/0295427 A1 | 9/2020 | Bayes et al. |
| 2020/0329555 A1* | 10/2020 | Gavagnin .............. H05K 3/146 |

OTHER PUBLICATIONS

Wu F.Y., "Theory of Resistor Networks: The Two-Point Resistance," arXiv:math-ph/0402038v2, Feb. 19, 2004, 35 Pages.

Zhang J., et al., "Causal RLGC(f) Models for Transmission Lines from Measured S-Parameters," Feb. 2010, vol. 52, No. 1, 11 Pages.

* cited by examiner

INTEGRATING GRAPHENE INTO THE SKIN DEPTH REGION OF HIGH SPEED COMMUNICATIONS SIGNALS FOR A PRINTED CIRCUIT BOARD

CROSS REFERENCE TO RELATED APPLICATION

This application is a continuation of U.S. patent application Ser. No. 17/703,051, entitled "Integrating Graphene Into the Skin Depth Region of High Speed Communications Signals in a Printed Circuit Board", filed Mar. 24, 2022, which is a continuation of U.S. patent application Ser. No. 17/079,970, entitled "Integrating Graphene Into the Skin Depth Region of High Speed Communications Signals in a Printed Circuit Board", filed Oct. 26, 2020, which claims priority under 35 U.S.C. § 119(e) to U.S. Provisional Patent Application Ser. No. 63/016,500, entitled "Integrating Graphene Into the Skin Depth Region of High Speed Communications Signals in a Printed Circuit Board", filed Apr. 28, 2020, the disclosures of which are incorporated herein by reference their entireties for all purposes.

TECHNICAL FIELD

The present disclosure relates to high speed signal communications implemented in a printed circuit board for electronic devices.

BACKGROUND

High speed digital communications, error correction techniques, coding methods, and the copper medium they travel through has finally reached a limit. In particular, at speeds up to 112 Gbps, it may be difficult for such high speed signals to effectively travel for run lengths more than 2 inches, making conventional copper based signal traces impractical and forcing the migration to fiber. It is desirable to provide enhanced copper based signal traces having sufficient conductivity to support high speed communication signals.

DESCRIPTION OF EXAMPLE EMBODIMENTS

Overview

Figure 1A:
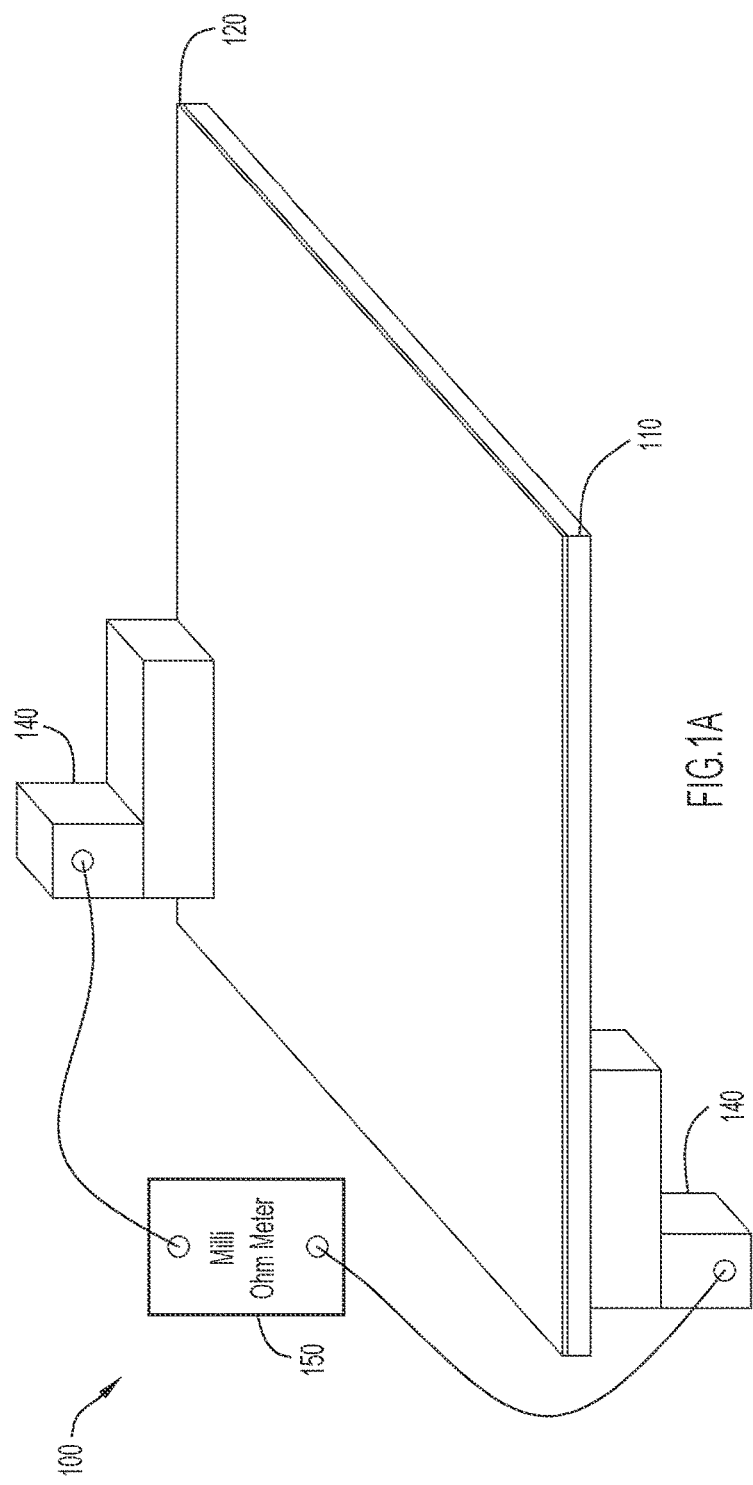
FIG. 1A depicts a view in perspective of an embodiment of a layer or sheet of copper with graphene applied to a surface of the copper sheet.

A conductive signal transmission structure is provided or transmission of signals for an electronic device that comprises a copper material and a graphene layer disposed within the copper material at a depth below a surface of the conductive signal transmission structure.

In addition, an apparatus is provided that comprises a printed circuit board (PCB), and a conductive signal transmission structure coupled with the PCB. The conductive signal transmission structure comprises a copper material and a graphene layer disposed within the copper material at a depth below a surface of the conductive signal transmission structure.

Further, a method is provided that comprises depositing graphene to form a graphene layer over a copper substrate, depositing copper over the graphene layer to form a conductive signal transmission structure with the graphene layer embedded beneath a surface of the conductive signal transmission structure, and integrating the conductive signal transmission structure with a printed circuit board (PCB).

Example Embodiments

As described herein, conductive signal transmission structures (also referred to herein as conductive signal structures), such as conductive traces or conductive wires for a printed circuit board (PCB), are formed comprising graphene mixed as one or more single carbon atom layers within a copper material, where the conductive signal structure can be formed having any suitable geometry as a wire (e.g., round wire) or a sheet (e.g., a rectangular copper foil sheet) depending upon a particular application.

In example embodiments, one or more graphene layers are disposed or embedded within a copper material forming a copper signal trace so as to render the trace particularly beneficial in coding, signaling and for error correct within a PCB for communications applications at high signal speeds up to 224 Gbps (e.g., using PAM or QAM based techniques). The conductive signal traces as described herein and which include embedded (and/or external) graphene layers can exhibit increased conductivity, a desirable skin depth and less trace loss in relation to conventional copper traces that renders such traces incorporated with graphene useful for high speed signaling.

Manufacturing techniques are also described herein for forming conductive signal structures comprising copper with graphene layers incorporated or embedded therein. The conductive signal structures can be formed with appropriately defined signaling geometries without losing any single layer carbon structure formed within the structure during the manufacturing process. A monolayer or bilayer of graphene can be provided within and beneath the surface of a copper foil or other copper material forming a trace, where the monolayer or bilayer remains within a skin depth region of the trace at high signal frequencies (e.g., frequencies in the gigahertz range). For example, graphene embedded copper signal traces can be formed in which one or more graphene layers are disposed or embedded within the copper material forming the trace so as to remain within a skin depth region of the trace at a Nyquist signal frequency of at least 14 GHz and further at a Nyquist signal frequency of 28 GHz or even greater. Optionally, the monolayer or bilayer can be covered by a thin (e.g., 0.1-0.3 µm) layer of copper (or, alternatively, another cover layer such as gold or silver cover layer). Alternatively, no Cu (or Au, or Ag) cover layer need be provided, such that a graphene layer is located at an external surface of the trace. The trace sub-surface including graphene monolayer or bilayer can be located at both surfaces of the conductive trace (e.g., at a prepeg-facing or first surface and at an opposing, core-facing or second surface) implemented within a PCB. In other embodiments described herein, a conductive wire that connects a component to a surface contact of a PCB can also be formed comprising copper with one or more graphene layers embedded therein. Conductive signal transmission structures as described herein can be utilized in or combined with a printed circuit board (PCB) for facilitating signal communications within the PCB and also between the PCB and components provided external to the PCB, where the PCB is implemented for use with any type of electronic device (e.g., electronic communication/networking devices, such as switches, routers, networking devices, etc. and/or any other type of electronic and/or computing devices).

Figure 1B:
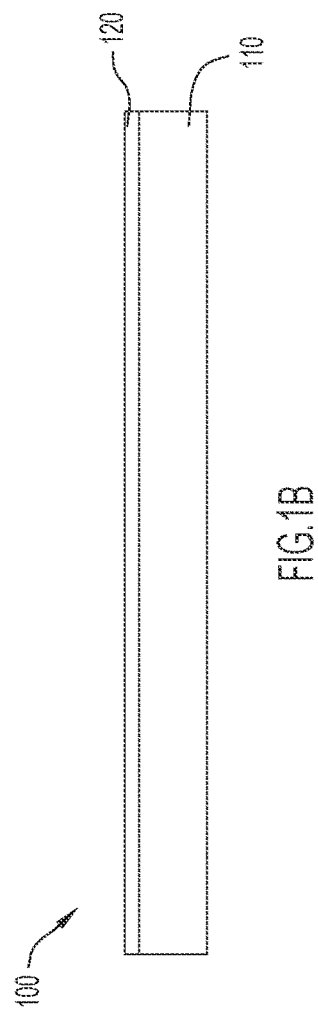
FIG. 1B depicts a side view in cross-section of the embodiment of FIG. 1A.

Providing one or more graphene layers within and/or at a surface of a conductive signal trace or wire will increase its conductivity so as to reduce signal or trace loss. Referring to FIGS. 1A and 1B, a conductive structure 100 is formed comprising a copper foil sheet 110 having a thickness ranging from about 0.35 mil to about 5.0 mils (e.g., no greater than about 2 mils) thickness, or about 0.25 oz/ft² to about 4 oz/ft² (e.g., no greater than about 1.75 oz/ft²), with a graphene layer 120 applied to a surface of the copper layer. The graphene layer 120 can have a thickness that is much less than the thickness of the copper foil sheet (e.g., from about 2.5 Angstroms to about 5.0 Ångstroms, depending upon whether the graphene layer is a monolayer or bilayer). The overall resistance of the conductive structure 100 can be measured, e.g., by securing copper bar clamps 140 to opposing ends of the structure and measuring resistance with an ohm meter 150. When comparing the conductive structure 100 to a copper foil sheet without any graphite layer, measured resistance is lower for the conductive structure 100, which also enables greater conductivity and a reduction in signal loss for a conductive trace or wire structure that is implemented with a PCB.

Figure 2:
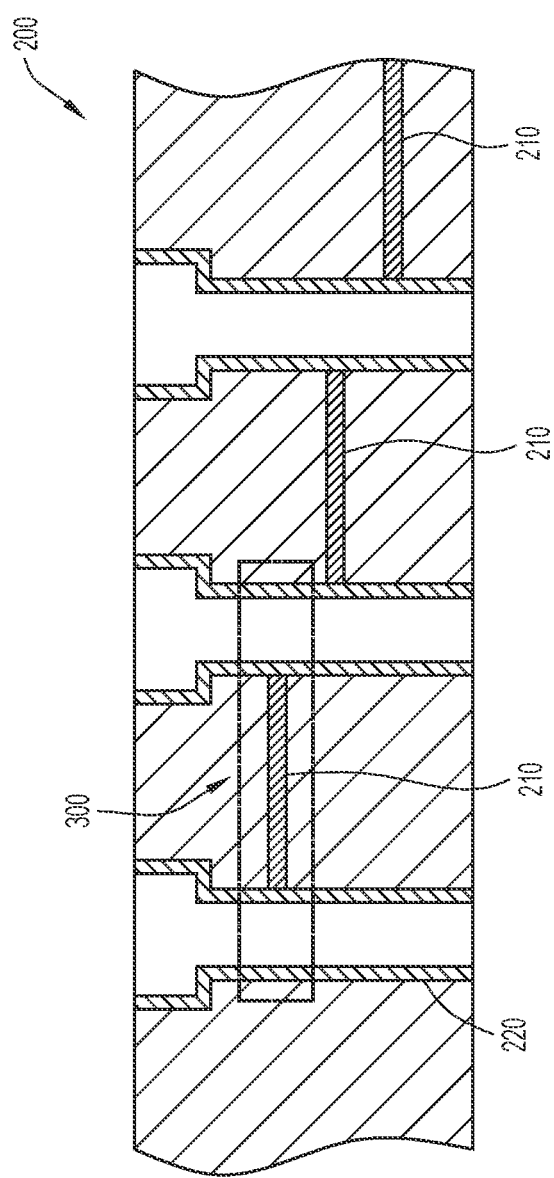
FIG. 2 is a cross-sectional view of an example embodiment of a printed circuit board (PCB) including conductive signal trace structures disposed within the PCB and connecting with vias extending through portions of the PCB.
Figure 3A:
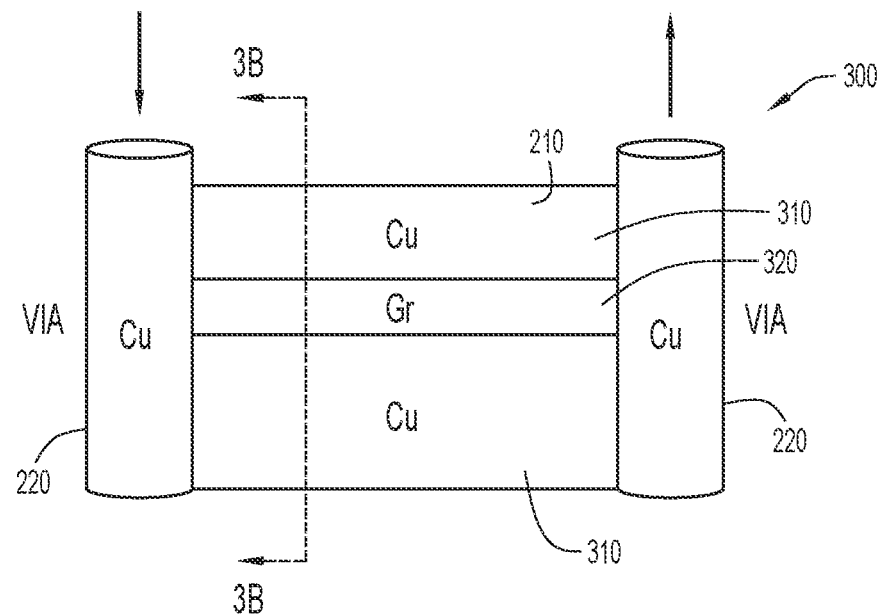
FIG. 3A depicts an enlarged view of a portion of the PCB of FIG. 2, including a conductive signal trace structure connecting a pair of vias.
Figure 3B:
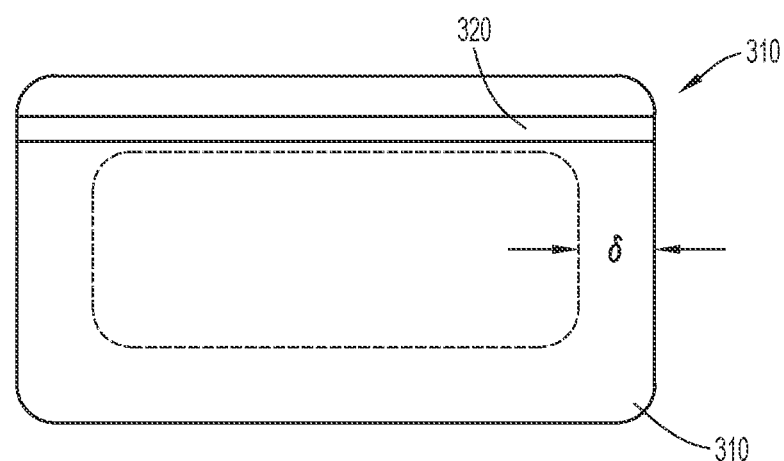
FIG. 3B depicts a cross-sectional view of the conductive signal trace structure of FIG. 3A.

Conductive signal traces comprising copper with one or more embedded graphene layers can be provided at a variety of levels or different layers within a PCB. An example embodiment is depicted in FIG. 2 showing a cross-sectional view of a PCB 200 including conductive traces 210 disposed at varying depths or layers within the PCB 200. The conductive traces 210 connect with vias 220, where such vias are plated through holes (PTHs) that extend to one or both surfaces of the PCB 200 (where such traces can connect with surface contacts of the PCB to facilitate connections with PCB components that mount to the PCB). An enlarged view 300 of a conductive trace 210 for the PCB 200 is depicted in FIGS. 3A and 3B (where FIG. 3B is a cross-sectional view of the conductive trace 210). For interfacing the trace with the PTH plating of the via, the inner graphene layer may not interface well with the PTH plating. In this situation, a connection between PTH interface and graphene inner layer of the trace can be achieved utilizing a direct metallization process (e.g., utilizing a Blackhole or a Shadow process) and using a carbon-based colloid to make the connection with the graphene layer.

As shown in FIGS. 3A and 3B, the conductive trace 210 comprises a foil or sheet having a generally rectangular cross-sectional geometry, where the trace comprises a copper sheet with a graphene layer embedded within the copper sheet. The PCB 200 can include any number of conductive traces 210 (e.g., one or more) that comprise substantially copper with a graphene layer embedded within the copper structure. The conductive trace is formed such that the graphene layer is a depth beneath a surface of the copper sheet so as to remain within the skin depth region 6 of the conductive trace even at a frequency of at least 14 GHz Nyquist, and even as large as 28 GHz Nyquist or greater. For example, the graphene layer can be provided at a depth below the conductive trace surface that is about 0.5 micrometer (µm) or less (e.g., about 0.3 µm or less) so as to remain within the skin depth region 6 of the conductive trace comprising substantially copper at Nyquist signal frequencies ranging from 14-28 GHz.

Figure 4:
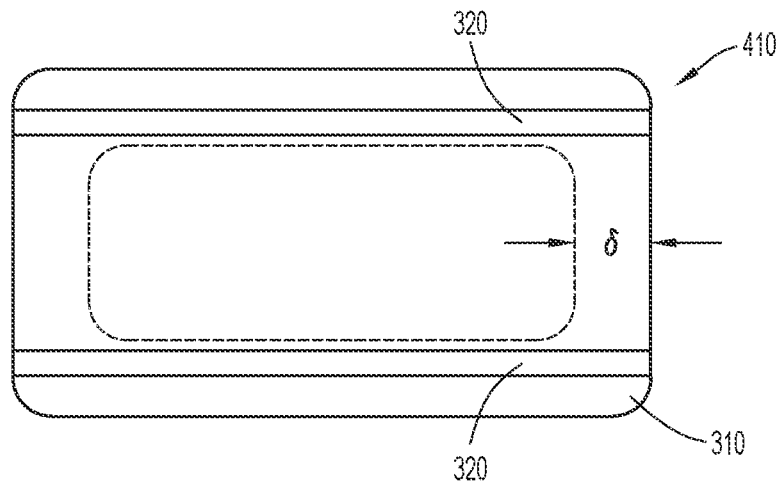
FIG. 4 depicts a cross-sectional view of an alternative embodiment of a conductive signal trace structure.

The conductive trace can also have other shapes as well as any number of graphene layers disposed at and/or beneath a surface of the copper structure. For example, referring to FIG. 4, a conductive trace 410 includes two graphene layers 320 disposed within a copper sheet or copper structure 310, where each graphene layer 320 is embedded within and near an opposing surface of the conductive trace 410 (e.g., at the prepeg facing surface and the core facing surface) and is located at a suitable depth that ensures the graphene layer remains within the skin depth region 6 of the trace 410 based upon the operations of the PCB with which the trace is integrated (e.g., Nyquist signal frequencies ranging from 14-28 GHz or greater).

Figure 5:
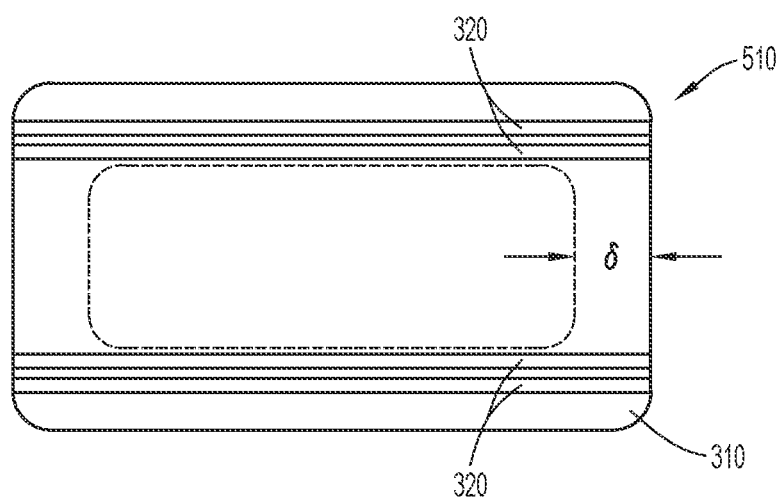
FIG. 5 depicts a cross-sectional view of another alternative embodiment of a conductive signal trace structure.

In another example embodiment depicted in FIG. 5, a conductive trace 510 is provided that includes a plurality of graphene layers 320 disposed within a copper structure 310. In particular, two graphene layers 320 are disposed near a first surface of the conductive trace 510, and two graphene layers 320 are disposed near an opposing, second surface of the conductive trace 510. Each trace is embedded beneath the trace layer at a suitable depth that remains within the skin depth region 6 of the trace based upon the operations of the PCB with which the trace is integrated (e.g., Nyquist signal frequencies ranging from 14-28 GHz or greater).

Figure 6A:
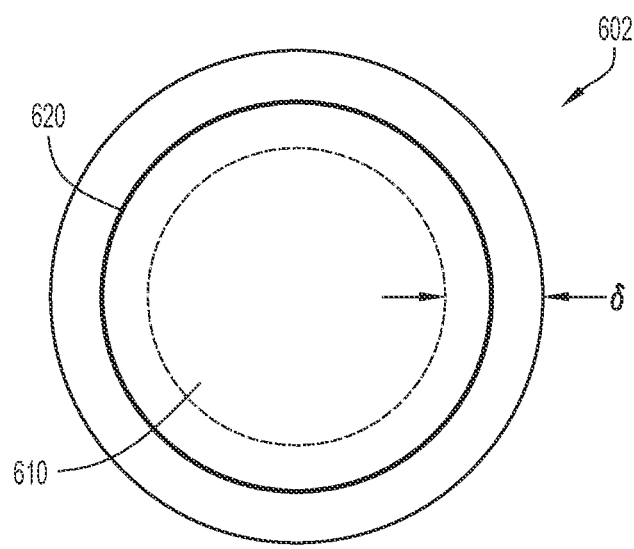
FIGS. 6A and 6B depict cross-sectional views of example embodiments a conductive signal wire structure.
Figure 6B:
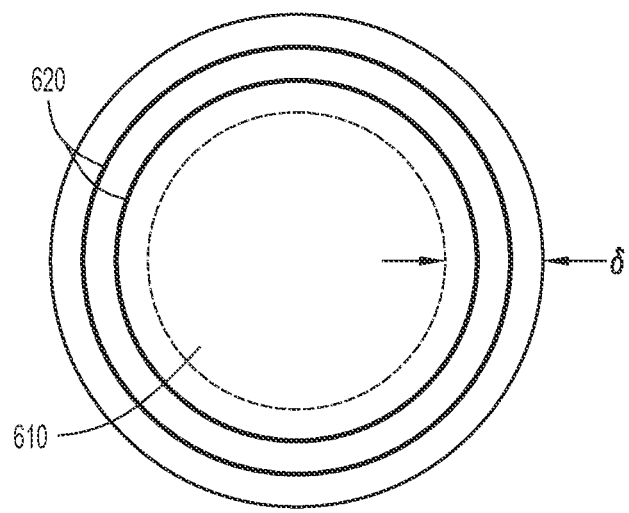

The graphene embedded copper signal structures described herein are not limited for integration as conductive trace structures within a PCB. The structures can also be implemented for use as any suitable conductive wiring and having other cross-sectional geometries that are suitably modeled as transmission lines for a specified application. As depicted in FIG. 6A, a signal transmission wire structure 602 is described herein having a generally round or circular cross-section, where a graphene layer 620 is embedded within the copper structure 610 at a depth that remains within the skin depth region 6 of rounded wire structure. The graphene layer 620 has an annular shape in cross-section and is cylindrical within the copper structure 610 along the length of the signal transmission wire structure 602. The rounded signal wire structure can be modified to include a plurality of annular graphene layers embedded within copper in a nested and concentric arrangement with each other, where each graphene layer is placed a suitable depth from the wire surface so as to be within the skin depth region of the wire structure based upon operations associated with the wire structure. An example embodiment of such a wire structure with a plurality of embedded and concentric graphene layers is depicted in FIG. 6B.

Figure 7:
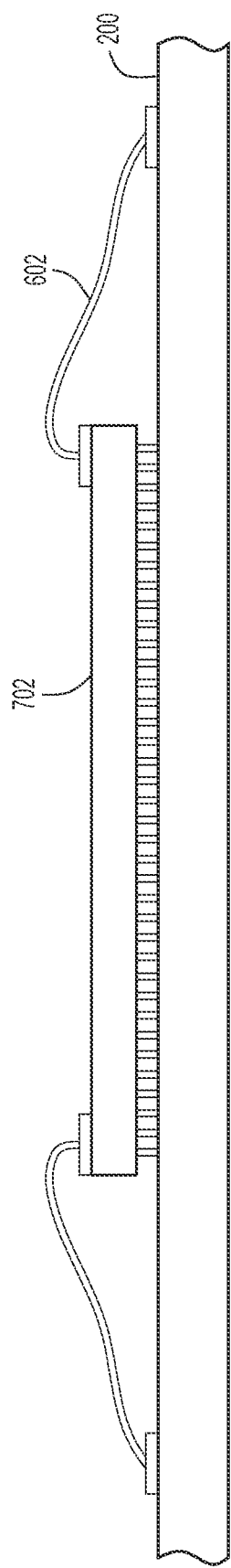
FIG. 7 depicts an example embodiment of a PCB including a component connected with the PCB via the conductive signal wire structure of FIG. 6A or 6B.

The signal transmission wire structure 602 can be implemented for connecting a circuit component at the surface of a PCB with other signal layers of the PCB. Referring to FIG. 7, an example embodiment of a PCB 200 includes a circuit component, application specific integrated circuit (ASIC) 702, connected at its surface (e.g., via a ball grid array or other suitable surface mount connection). Conductive signal wires, such as wire structure 602, connect the circuit component to certain areas and/or other components of the PCB (e.g., using a via/PTH to connect wire structure 602 to a signal layer within the PCB).

Manufacture of a conductive signal structure (e.g., a conductive signal trace or a conductive signal wire) that includes graphene embedded within copper can be achieved in any suitable manner that embeds graphene within a copper structure. In example embodiments, one or more layers of graphene are formed within copper by building up a series of consecutive layers onto each other via a suitable deposition process, such as an electrodeposition process, a physical vapor deposition (PVD) process, or a chemical vapor deposition (CVD) process. Depending upon a particular application, the deposition process can be atmospheric, at low pressure or at vacuum pressure to selectively control an amount/thickness and locations at which carbon and copper is deposited on a base structure or substrate.

Figure 8:
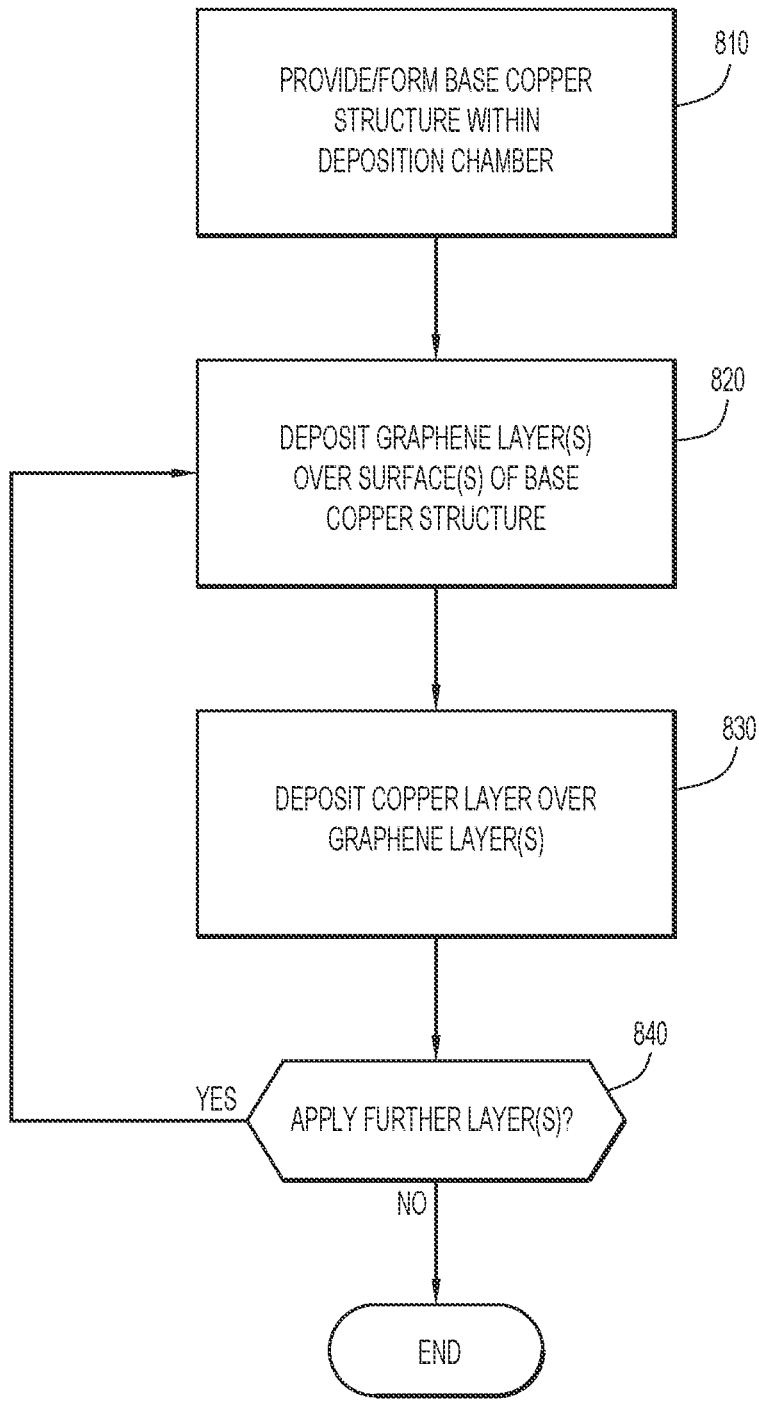
FIG. 8 is a flowchart describing process steps associated with forming a conductive signal structure as described herein.

An example CVD process for manufacturing a conductive signal structure is described with reference to the flowchart of FIG. 8. Utilizing chemical vapor deposition (CVD) techniques, a series of carbon and copper layers can be built up (with, e.g., graphene layers disposed within copper layers) within a CVD chamber at temperatures ranging from about 900° C. to about 1100° C. for a time period within a range from about 10 minutes to about 60 minutes per deposited layer.

At 810, a base copper structure is provided or formed within a CVD chamber. For example, a preformed copper foil sheet having a suitable thickness or a copper wire can be provided within the CVD chamber. For example, the base copper structure can be provided as a foil sheet with suitable dimensions to facilitate forming a signal trace as depicted in FIGS. 3A, 3B, 4 and 5. The base copper structure can also be provided as a copper wire with suitable dimensions to facilitate forming of a signal wire as depicted in FIGS. 6A and 6B. Alternatively, a copper structure having a desired base geometry can initially be formed via CVD within the chamber. Any suitable copper precursor as well as any suitable carbon precursor can be utilized that facilitates deposition of copper and carbon within the CVD chamber at suitable thicknesses and along selected surface portions of the base copper structure.

At 820, one or more graphene layers are deposited over selected surface portions of the base copper structure within the CVD chamber. Graphene can be atomically deposited along a surface of the base copper structure as a single atomic layer or monolayer or as a plurality of atomic layers (e.g., as a bilayer or as three or more built up atomic layers), depending upon the desired thickness of the resultant graphene layer to be deposited. In a non-limiting example, the graphene layer can be deposited as a monolayer or a bilayer and range from about 2.5 Ångstroms to about 5.0 Ångstroms in thickness. Within the CVD chamber, a vacuum is maintained under a low pressure gaseous atmosphere (e.g., providing a combination of hydrogen and argon within the chamber). Low pressure methane can be introduced as the precursor gas to provide the source of carbon to be deposited on the copper structure, where the methane is converted to graphene when contacting the hot surface of the copper layer. In the example of a copper foil trace, graphene can be deposited over one or both opposing surfaces of the planar copper sheet. In the example of a copper wire, graphene can be deposited at the copper wire surface around its annular perimeter so as to substantially circumferentially cover the copper wire surface area along a selected length (e.g., the entire length) of the copper wire.

At 830, copper is deposited (utilizing a suitable precursor compound) over the deposited graphene, resulting in graphene being embedded within the resultant copper structure. A sufficient amount of copper is deposited to ensure that the graphene is embedded a sufficient depth below the resultant copper structure exterior surface so as to be within the skin depth region of the structure based upon a prescribed or specified signal frequency for a PCB or other component with which the conductive signal structure will be used. In an example embodiment, copper is deposited over the graphene layer in a suitable amount to form a thickness of copper from about 0.1 µm to about 0.3 µm. For a copper signal structure (i.e., a signal structure that is substantially copper) that will be used for PCB and/or other electronic component operations that perform at high signal frequencies in the gigahertz range (e.g., as high as 14-28 GHz Nyquist or greater), the one or more graphene layers should reside within a thickness boundary from the exterior surface of the conductive signal structure at a depth within a range from at least about 0.10 µm and no greater than about 0.5 µm (based upon a rated signal frequency for the conductive signal structure, where increasing signal frequency reduces skin depth thickness).

If further graphene and/or copper layers are to be provided (determined at step 840), then steps 820 and/or 830 of the process can be repeated. This results in the formation of conductive signal structures that can include a plurality of graphene layers separated from each other by copper, such as the embodiments depicted in FIGS. 4, 5 and 6B, where all the embedded graphene layers are at a depth below the exterior surface of the conductive signal structure that remains within the skin depth of the conductive signal structure based upon the signal frequency specifications associated with the conductive signal structure.

In other embodiments, a graphene layer can also be deposited such that the graphene layer is exposed at (i.e., not embedded within) the exterior surface of the conductive signal structure. In still other embodiments, a metal such as gold or silver can be applied (e.g., deposited in a similar manner as described herein for carbon and copper) as a cover layer for the conductive signal structure (either directly over graphene or over copper that forms an exterior surface portion of the conductive signal structure).

Thus, the manufacturing techniques described herein facilitate the formation of conductive signal structures that comprise copper (e.g., a copper base or core) and one or more graphene layers embedded within the structures at a depth the maintains the graphene layer(s) within the skin depth region of the conductive signal structures for their specified use (e.g., integration with a PCB for a particular operation). The conductive signal structures can comprise signal traces disposed within a layer of a PCB, as signal wires disposed external to the PCB, or any other signal structure configured for use with an electronic component. Transmission line modeling can be performed to determine a suitable geometry, signal path length and configuration for a graphene embedded copper signal structure that will provide enhanced resistance, inductance, conductance and capacitance (RLGC) parameters for a transmission line of a PCB (where graphene contribution within the copper signal structure is accounted for). In particular, transmission line modeling techniques for specific graphene embedded copper signal structures can be performed to determine DC resistance and conductivities along the transmission line as well as AC resistance and RLGC parameters at frequencies up to and beyond 224 GHz.

Figure 9:
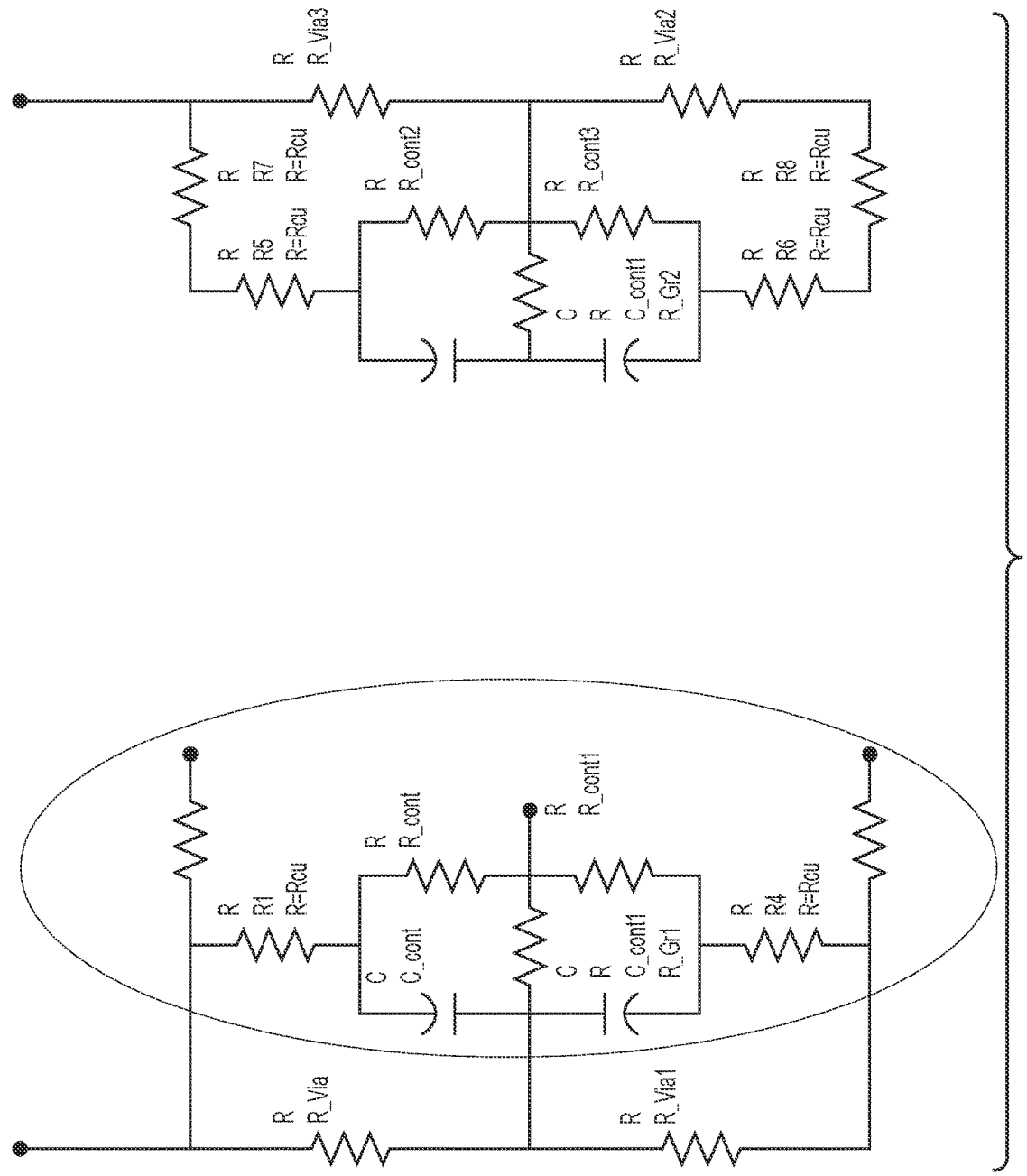
FIG. 9 depicts a DC unit circuit model for determination of DC resistance and conductance across a graphene embedded copper trace.

Referring to the example embodiment of a graphene embedded copper trace connected between two vias as depicted in FIGS. 2 and 3A, a DC (direct current) unit circuit model can be developed as depicted in FIG. 9 for determination of DC resistance and conductance across the trace. In this DC unit circuit model, the following values are defined as follows:

R_cont is contact resistance between graphene and copper
R_Gr is graphene resistance per unit length
Rcu is copper resistance per unit length
R_via is via resistance per unit length
C_cont is capacitive coupling between graphene and copper In the DC calculation, capacitance can be eliminated. The values R_cont, C_cont and R_Gr can be fitted measurements. The DC resistance calculation of the conductive trace can be calculated based upon a two-point resistance theory as described in F. Y. Wu, *Theory of resistor networks: The two-point resistance*, Journal of Physics A 37, 6653-6673 (2004). In this calculation, $R_{ij}=R_{ji}$ is the resistance of the resistor connecting nodes i and j, and conductance is as follows:

$$c_{ij}=c_{ji}=R_{ij}^{-1} \tag{1}$$

The resistance at 1 and N nodes is:

$$R_{1N} = \sum_{i=2}^{N} \frac{1}{l_i}(\psi_{i1} - \psi_{iN})^2 \tag{2}$$

For Equation (2), are eigenvalues and Equation (3) presents that eigenvectors of the matrix for Equation (4):

$$\Psi_i = (\psi_{11}, \psi_{12}, \ldots, \psi_{1N}), i = 2, 3, \ldots, N \tag{3}$$

$$\begin{pmatrix} c_1 & -c_{12} & \cdots & -c_{1N} \\ -c_{12} & c_2 & \cdots & -c_{2N} \\ \vdots & \vdots & \ddots & \vdots \\ -c_{1N} & -c_{2N} & \cdots & c_N \end{pmatrix} \tag{4}$$

$$c_i \equiv \sum_{j=1}^{N}{}' c_{ij}.$$

Figure 10:
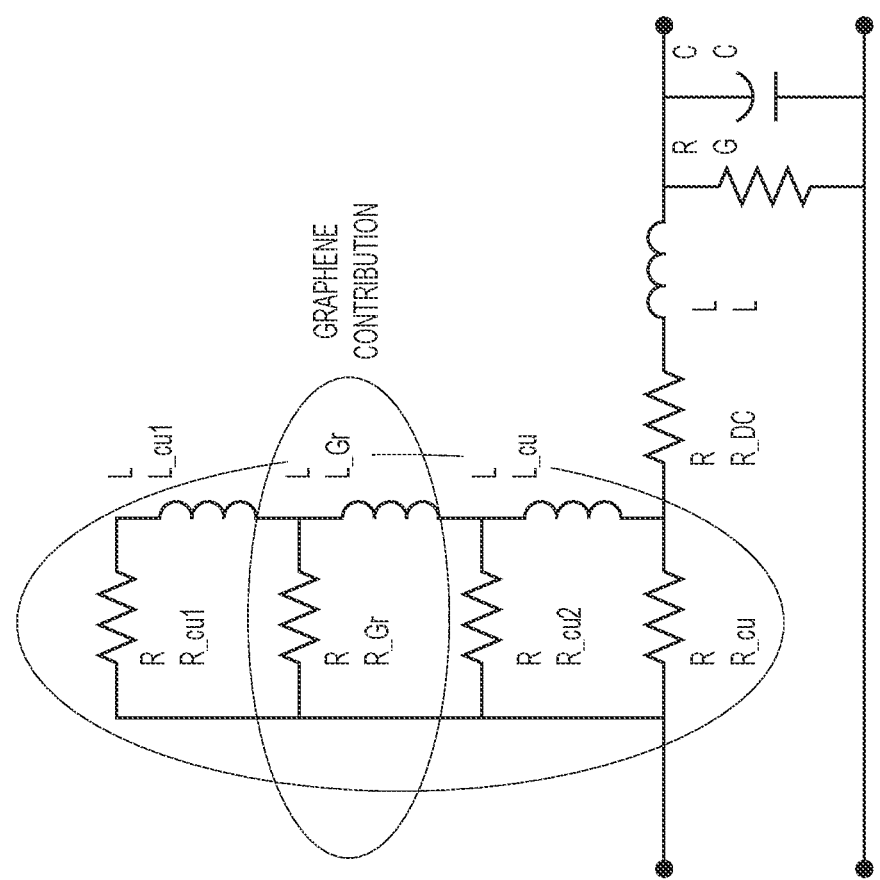
FIG. 10 depicts an AC transmission line model for determination of a frequency dependent resistance across a graphene embedded coper trace.

An AC (alternating current) transmission line model for a trace, which takes into account skin effect, is depicted in FIG. 10. In this model, the values R_cu, L_cu, R_cu1, R_cu2, L_cu, L_cu1, L_cu2, G, C and L parameters can be found from fitting to insertion loss of same PCB with only a copper trace (i.e., copper trace without graphene). The values R_Gr and L_Gr (very small for graphene) can be found from fitting to the measured insertion loss of the transmission line.

Figure 11A:
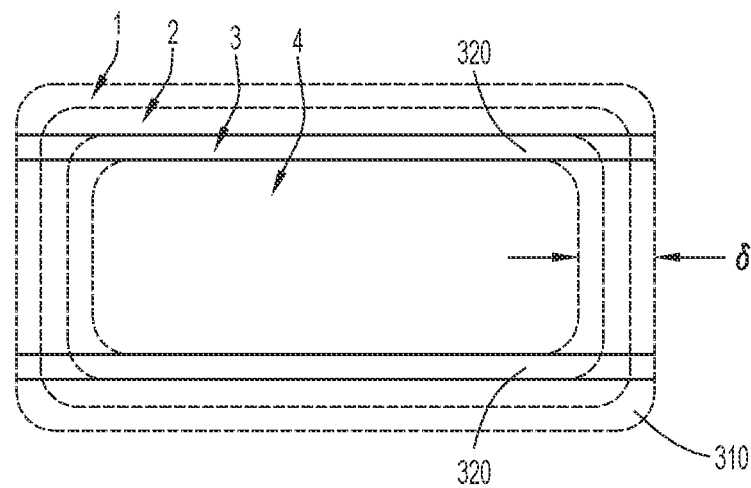
FIG. 11A depicts a cross-sectional view of the conductive signal trace structure of FIG. 4 and further including concentric shapes within the cross-section that correspond with ladder sections for a R-L ladder circuit model shown in FIG. 11B.
Figure 11B:
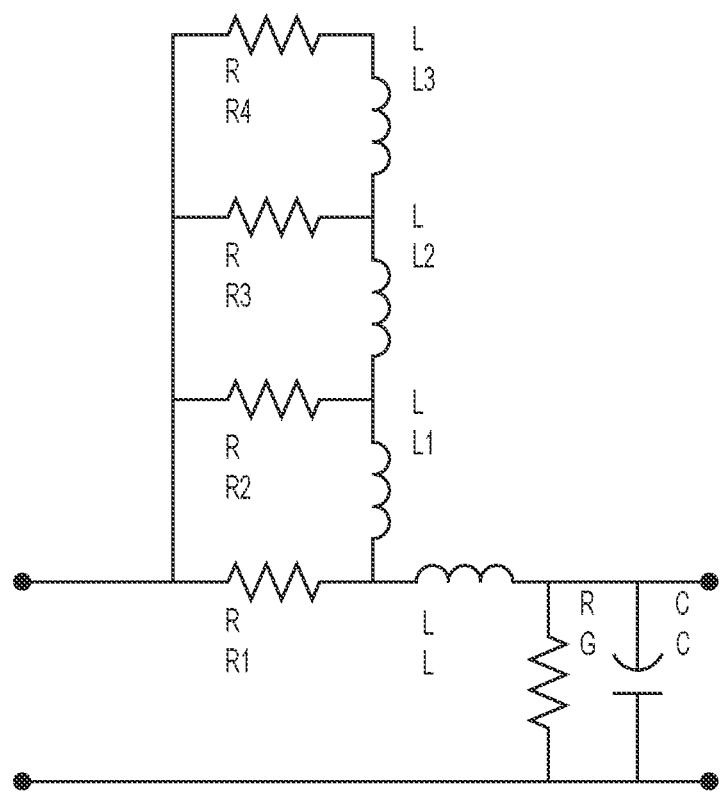
FIG. 11B depicts a R-L ladder circuit model for the conductive trace of FIG. 11A.

The skin effect of the conductive trace can be modeled with a selected number of R-L ladder circuits (refer, e.g., to S. Kim and D. P. Neikirk, *Compact equivalent circuit model for the skin effect*, 1996 IEEE MTT-S International Microwave Symposium Digest, San Francisco, CA, USA, 1996, pp. 1815-1818, Vol. 3). The number of R-L ladder circuits provided in the model can be based upon factors such as geometry of the conductive trace, number and/or locations of graphene layers embedded within the copper signal structure. As an example, utilizing the conductive trace geometry depicted in FIG. 4, the skin effect of this structure can be modeled as depicted in FIGS. 11A and 11B. The skin effect is modeled utilizing a four deep ladder circuit which divides the cross section conductor into four concentric shapes (represented by the numbers 1, 2, 3 and 4) and with each shape being represented by one ladder section (with R1 being the outermost ring, followed by R2, then R3 and then R4 being the innermost ring). Utilizing such a model with a four R-L ladder circuit configuration, the overall frequency dependent resistance of the conductive trace with embedded graphene layers can be determined as follows:

$$R_t(f) = \cfrac{\left(\cfrac{\left(\cfrac{(R_4 + j\omega L_3)R_3}{R_4 + j\omega L_3 + R_3} + j\omega L_2\right)R_2}{\cfrac{(R_4 + j\omega L_3)R_3}{R_4 + j\omega L_3 + R_3} + j\omega L_2 + R_2} + j\omega L_1\right)R_1}{\cfrac{\left(\cfrac{(R_4 + j\omega L_3)R_3}{R_4 + j\omega L_3 + R_3} + j\omega L_2\right)R_2}{\cfrac{(R_4 + j\omega L_3)R_3}{R_4 + j\omega L_3 + R_3} + j\omega L_2 + R_2} + j\omega L_1 + R_1} \tag{5}$$

which is also described as:

$$R_t(f) = ((((R_4+i\omega L_3)\|R_3+i\omega L_2)\|R_2)+i\omega L_1)\|R_1 \tag{6}$$

Depending upon the number of graphene layers embedded within the conductive copper structure, the model can include any number of R-L ladder circuits concentrically nested within the cross-section of the structure to determine a frequency dependent overall resistance for the structure. For example, a conductive structure modeled with M ladders will yield the following formula for overall resistance:

$$R_t(f)=(((((R_M+i\omega L_{M-1}) \ldots \|R_4+i\omega L_3)\|R_3+i\omega L_2)\|R_2)+i\omega L_1)\|R_1 \tag{7}$$

Modeling can also be performed to obtain accurate frequency dependent RLGC transmission line parameters for a particular conductive signal structure with one or more graphene layers embedded therein. Example RLGC modeling techniques that can be utilized, based upon an AC transmission line model for a graphene embedded conductive trace (such as is depicted in the example embodiment of FIGS. 11A and 11B), are described by J. Zhang et al., *Causal RLGC(f) Models for Transmission Lines From Measured S-Parameters*, IEEE Transactions on Electromagnetic Compatibility, Vol. 52, No. 1, pp. 189-198, Institute of Electrical and Electronics Engineers (IEEE), February 2010.

Accordingly, a variety of different conductive signal transmission structures comprising copper with one or more graphene layers embedded therein can be integrated with a PCB to enhance signal transmission at high signal frequencies. Modeling techniques such as those described herein are useful for determining the skin effect and other transmission line parameters associated with different PCB architectures when utilizing such graphene embedded signal transmission structures. Such signal transmission structures provide enhanced conductivity by maintaining graphene within the skin depth region of the structures, which in turn enhances high speed signaling operations for the PCB and/or other electronic components associated with the PCB.

Thus, in example embodiments, a conductive signal transmission structure for transmission of signals for an electronic device can comprise a copper material and a graphene layer disposed within the copper material at a depth below a surface of the structure.

The conductive signal transmission structure can further comprise a plurality of graphene layers disposed within the copper material.

The depth of the graphene layer below the surface of the conductive signal transmission structure can be within a skin depth region of the conductive signal transmission structure when a transmission signal applied to the conductive signal transmission structure has a Nyquist frequency that is at least about 14 gigahertz (GHz).

The copper material can have a rectangular cross-section and include a first graphene layer disposed below a first surface of the copper material and a second graphene layer disposed below a second surface of the copper material that opposes the first surface.

The copper material can also have a round cross-section and the graphene layer disposed within the copper material has an annular shape. In addition, the conductive signal transmission structure can further comprise a plurality of graphene layers disposed within the copper material, each graphene layer having an annular shape.

The graphene layer can have a thickness ranging from about 2.5 Ångstroms to about 5.0 Ångstroms.

In other example embodiments, an apparatus can comprise a printed circuit board (PCB), and a conductive signal transmission structure coupled with the PCB, where the conductive signal transmission structure can comprise a copper material and a graphene layer disposed within the copper material at a depth below a surface of the conductive signal transmission structure.

The conductive signal transmission structure of the apparatus can comprise a plurality of graphene layers disposed within the copper material.

The conductive signal transmission structure of the apparatus can comprise a signal trace disposed beneath a surface of the PCB. Alternatively, the conductive signal transmission structure of the apparatus can comprise a signal wire connecting a component mounted to a surface of the PCB with the PCB.

The copper material of the apparatus can have a round cross-section and the graphene layer disposed within the copper material has an annular shape.

The apparatus can further comprise a plurality of graphene layers disposed within the copper material, each graphene layer having an annular shape.

The depth of the graphene layer below the surface of the conductive signal transmission structure for the apparatus can be within a skin depth region of the conductive signal transmission structure when a transmission signal applied to the conductive signal transmission structure has a Nyquist frequency that is at least about 14 gigahertz (GHz).

The graphene layer of the apparatus can have a thickness ranging from about 2.5 Ångstroms to about 5.0 Ångstroms.

In further example embodiments, a method can comprise depositing graphene to form a graphene layer over a copper substrate, depositing copper over the graphene layer to form a conductive signal transmission structure with the graphene layer embedded beneath a surface of the conductive signal transmission structure, and integrating the conductive signal transmission structure with a printed circuit board (PCB).

The depositing of graphene followed by depositing of copper can be performed a plurality of times to form a plurality of graphene layers embedded beneath the surface of the conductive signal transmission structure.

The copper substrate for the method can have a rectangular cross-section, and further, the depositing graphene can further comprise depositing a first graphene layer over a first surface of the copper substrate and depositing a second graphene layer over a second surface of the copper substrate. In addition, the depositing copper can further comprise depositing a first copper layer of the first graphene layer and depositing a second copper layer over the second graphene layer such that the first and second graphene layers are embedded within the conductive signal transmission structure.

The copper substrate of the method can have a round cross-section, and further, the depositing graphene can further comprise depositing graphene around a circumference of the copper substrate so as to form an annular graphene layer, and the depositing copper can further comprise depositing copper over the annular graphene layer so as to embed the annular graphene layer within the conductive signal transmission structure.

The graphene layer of the method can be embedded below the surface of the conductive signal transmission structure within a skin depth region of the conductive signal transmission structure when a transmission signal applied to the conductive signal transmission structure has a Nyquist frequency that is at least about 14 gigahertz (GHz).

The above description is intended by way of example only. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
a printed circuit; and
a conductive signal transmission structure coupled with the printed circuit, the conductive signal transmission structure comprising a copper material and a plurality of graphene layers, each graphene layer being disposed within the copper material at a depth below a corresponding surface of the conductive signal transmission structure, wherein the depth of each graphene layer below the corresponding surface of the conductive signal transmission structure is within a skin depth region of the conductive signal transmission structure when a transmission signal applied to the conductive signal transmission structure has a signal speed of at least 112 Gbps.

2. The apparatus of claim 1, wherein the depth of the graphene layer below the surface of the conductive signal transmission structure is within a skin depth region of the conductive signal transmission structure when a transmission signal applied to the conductive signal transmission structure has a signal speed of at least 224 Gbps.

3. The apparatus of claim 1, wherein the copper material has a rectangular cross-section and includes a first graphene layer disposed below a first surface of the copper material and a second graphene layer disposed below a second surface of the copper material that opposes the first surface.

4. The apparatus of claim 1, wherein the copper material has a round cross-section and the graphene layer disposed within the copper material has an annular shape.

5. The apparatus of claim 1, wherein each graphene layer has a thickness ranging from about 2.5 Ångstroms to about 5.0 Ångstroms.

6. The apparatus of claim 1, wherein each graphene layer is provided at a depth below the corresponding surface of the conductive signal transmission structure that is about 0.5 micrometers or less.

7. The apparatus of claim 1, wherein the conductive signal transmission structure comprises a signal trace disposed within the printed circuit.

8. The apparatus of claim 1, wherein the conductive signal transmission structure comprises a signal wire disposed external to the printed circuit.

9. The apparatus of claim 8, wherein the signal wire connects with a component mounted to a surface of the printed circuit.

10. An apparatus comprising:
a printed circuit; and
a conductive signal transmission structure coupled with the printed circuit, the conductive signal transmission structure comprising a copper material and a plurality of graphene layers, each graphene layer being disposed within the copper material at a depth below a corresponding surface of the conductive signal transmission structure, wherein the depth of each graphene layer below the corresponding surface of the conductive signal transmission structure is within a skin depth region of the conductive signal transmission structure when a transmission signal applied to the conductive signal transmission structure has a Nyquist frequency that is at least about 14 gigahertz (GHz).

11. The apparatus of claim 10, wherein the depth of each graphene layer below the corresponding surface of the conductive signal transmission structure is within a skin depth region of the conductive signal transmission structure when a transmission signal applied to the conductive signal transmission structure has a Nyquist frequency that is as large as 28 GHz or greater.

12. The apparatus of claim 10, wherein the copper material has a rectangular cross-section and includes a first graphene layer disposed below a first surface of the copper material and a second graphene layer disposed below a second surface of the copper material that opposes the first surface.

13. The apparatus of claim 10, wherein the copper material has a round cross-section and the graphene layer disposed within the copper material has an annular shape.

14. The apparatus of claim 10, wherein the conductive signal transmission structure comprises a signal trace disposed within the printed circuit.

15. The apparatus of claim 10, wherein the conductive signal transmission structure comprises a signal wire disposed external to the printed circuit.

16. The apparatus of claim 15, wherein the signal wire connects with a component mounted to a surface of the printed circuit.

17. A method comprising:
forming a conductive signal transmission structure by:
depositing graphene to form a graphene layer over a copper substrate; and
depositing copper over the graphene layer to form a conductive signal transmission structure with the graphene layer embedded beneath a surface of the conductive signal transmission structure;
wherein depositing of graphene followed by depositing of copper is performed a plurality of times to form a plurality of graphene layers with each graphene layer being embedded beneath a corresponding surface of the conductive signal transmission structure, and a depth of each graphene layer below the corresponding surface of the conductive signal transmission structure is located within a skin depth region of the conductive signal transmission structure when a transmission signal applied to the conductive signal transmission structure has a signal speed of at least 112 Gbps; and
coupling the conductive signal transmission structure with a printed circuit.

18. The method of claim 17, wherein the conductive signal transmission structure is formed as a signal trace and is coupled with the printed circuit so as to be disposed within the printed circuit.

19. The method of claim 17, wherein the conductive signal transmission structure is formed as a signal wire that is coupled with the printed circuit so as to be external to the printed circuit.

20. The method of claim 17, wherein depositing of graphene followed by depositing of copper is performed is performed such that each graphene layer is provided at a depth below the corresponding surface of the conductive signal transmission structure that is about 0.5 micrometers or less.

* * * * *